United States Patent
Bentley et al.

(10) Patent No.: US 7,243,421 B2
(45) Date of Patent: Jul. 17, 2007

(54) ELECTRICAL CONNECTION OF COMPONENTS

(75) Inventors: Philip Gareth Bentley, Cambridge (GB); James Edward Fox, Cambridge (GB); Alan Lionel Hudd, Nuthampstead (GB); Martyn John Robinson, Cambridge (GB); Michael Graham Johnson, Hertfordshire (GB); Ian Williams, Rutland (GB)

(73) Assignee: Conductive Inkjet Technology Limited, West Yorkshire (GB)

( * ) Notice: Subject to any disclaimer, the term of this patent is extended or adjusted under 35 U.S.C. 154(b) by 143 days.

(21) Appl. No.: 10/975,500

(22) Filed: Oct. 29, 2004

(65) Prior Publication Data

US 2005/0141150 A1    Jun. 30, 2005

Related U.S. Application Data

(60) Provisional application No. 60/558,479, filed on Apr. 1, 2004.

(30) Foreign Application Priority Data

Oct. 29, 2003  (GB) ................................. 0325247.5
Jan. 28, 2004  (WO) ..................... PCT/GB04/00358
Mar. 31, 2004  (GB) ................................. 0407303.7

(51) Int. Cl.
*H05K 3/30*   (2006.01)

(52) U.S. Cl. ............................. 29/832; 29/825; 29/833; 29/840

(58) Field of Classification Search ................. 29/825, 29/830, 832, 833, 840
See application file for complete search history.

(56) References Cited

U.S. PATENT DOCUMENTS

| 3,082,327 | A | | 3/1963 | Rice ........................ 250/208.6 |
| 4,494,139 | A | * | 1/1985 | Shima et al. ................. 348/87 |
| 5,469,012 | A | | 11/1995 | Suzuki et al. |
| 5,510,139 | A | * | 4/1996 | Deissner et al. ........... 427/97.2 |
| 5,556,810 | A | | 9/1996 | Fujitsu ........................ 437/209 |
| 5,645,707 | A | * | 7/1997 | Omoto ........................ 205/114 |
| 5,917,707 | A | | 6/1999 | Khandros et al. ........... 361/776 |
| 5,998,239 | A | | 12/1999 | Tomizawa |
| 6,194,032 | B1 | * | 2/2001 | Svedberg et al. ........... 427/466 |
| 6,344,973 | B1 | * | 2/2002 | Feustel et al. .............. 361/760 |
| 6,401,332 | B1 | * | 6/2002 | Canova ....................... 29/840 |
| 6,468,835 | B1 | | 10/2002 | Blanc et al. ................. 438/127 |
| 6,668,450 | B1 | * | 12/2003 | Haller et al. .................. 29/846 |
| 6,769,619 | B2 | | 8/2004 | Zafrany et al. .............. 235/487 |
| 6,794,727 | B2 | | 9/2004 | Leduc et al. ................. 257/531 |
| 2002/0056571 | A1 | * | 5/2002 | Canova ....................... 174/261 |
| 2003/0098470 | A1 | | 5/2003 | Williams ..................... 257/200 |

FOREIGN PATENT DOCUMENTS

DE    4434383    3/1996
JP    2003-133716    5/2003

* cited by examiner

*Primary Examiner*—Carl J. Arbes
(74) *Attorney, Agent, or Firm*—Morgan Lewis & Bockius LLP

(57) ABSTRACT

A contact of a component is electrically connected to an associated contact of an electrical circuit, typically formed on a substrate, by depositing material between the contacts, the material forming or being processed to form an electrical connection between the contacts. The invention also provides apparatus for this purpose and a resulting circuit.

16 Claims, 1 Drawing Sheet

ELECTRICAL CONNECTION OF COMPONENTS

The present application claims priority benefit based on U.S. Application No. 60/558,479, filed Apr. 1, 2004, GB Application 0325247.5, filed Oct. 29, 2003, GB Application 0407303.7, filed Mar. 31, 2004 and PCT/GB2004/000358, filed Jan. 28, 2004, the contents of which are incorporated herein by reference.

FIELD OF THE INVENTION

This invention relates to electrical connection of components, e.g. connection of a microchip or other electronic component to electrical circuitry on a substrate in the form of a printed circuit board, and concerns a method of electrically connecting an electrical contact of a component to an electrical contact of an electrical circuit, apparatus for this purpose, and the resulting circuit.

BACKGROUND TO THE INVENTION

Various techniques are known for connecting a component such as a microchip (chip) to electrical circuitry on a printed circuit board (substrate).

Wire bonding is the oldest traditional approach. In this technique, the component is accurately placed in position (to within +/−30 microns) on the substrate, with contacts on the upper surface of the component (remote from the substrate) adjacent to respective associated contacts on the upper surface of the substrate. The contacts on the component are in the form of leads, 200 microns in length extending upwardly from the component. The component is secured in position on the substrate by die bonding with an adhesive. A wire bonding machine places a length of wire, typically 25 microns diameter gold or aluminium wire, to extend between a pair of associated contacts (one on the component and one on the substrate) and bonds the ends of the wire to the contacts, e.g. by ultrasonic or thermal welding. The wire bonds at this stage are fragile, exposed loops of metal that protrude upwardly from the substrate surface, and usually the wires are not insulated. The wire bonds are therefore typically encapsulated, e.g. in silicone material, to protect them from damage and insulate them, preventing contact between wire bonds and possible short circuiting.

Because the wire bonds protrude from the surface, this method is not ideal for flat products such as smart cards or RFIDs (radio frequency identification devices). Although this process can be fully automated, it is expensive and can cost in the region of 10 cents (US) per chip for a processor with many connections. The output rate is slower than desired, with a typical automated machine outputting around 10,000 components per hour. Also, the output rate is linked to the complexity of the component or number of bonds to be made; therefore more complex components are produced more slowly.

Another approach is tab bonding. In this technique, the substrate is provided with a hole slightly larger than the footprint of the component, with contacts appropriately located on the upper surface of the substrate adjacent the hole. The component has contacts in the form of outwardly extending, horizontally oriented wires or legs. The component is placed part way into the hole, with the protruding legs in contact with the associated contacts on the substrate. The pairs of associated contacts (one on the component and one on the substrate) are then welded or crimped together to complete the circuit as required. This approach requires the substrate to be custom designed and made, with appropriate holes and contacts, and so is expensive and hence mainly only used for higher cost applications.

In a more recent approach, known as 'flip chip', the component is placed on the substrate in inverted condition, i.e. with the contacts on the lower surface of the component, adjacent the substrate. Contacts on the component or on the substrate are raised or 'bumped' to provide a protruding electrical connection between the component and substrate circuit. Several different procedures are known for forming the bumps, including palladium (Pd) bumping, nickel gold (NiAu) bumping, polymer bumping, solder bumping, possibly with under bump metallisation (UBM).

In a further approach, components are accurately pre-mounted on a supporting sheet or tape, known as an interposer, that has appropriately located contacts for electrical connection to the components. The interposer with mounted components is then placed on the substrate and electrically connected thereto via contact pads on the interposer and substrate. The contact pads are relatively large, typically several square millimetres in area, so placement of the interposer on the substrate need not be carried out with great accuracy. The contacts are usually pressed or crimped together to complete the electrical connection between the interposer, and hence components, and the substrate. This technique has the drawbacks of using an additional component, namely the interposer, and of requiring an additional processing step.

SUMMARY OF THE INVENTION

In one aspect, the present invention provides a method of electrically connecting a contact of a component to an associated contact in or for an electrical circuit, comprising depositing material between the contacts, the material forming or being processed to form an electrical connection between the contacts.

The connection from the contact of the component may be to an associated contact of an electrical circuit, an associated contact of another component or another contact of the original component. The electrical connection may itself constitute in part another component or part thereof.

A component typically requires more than one connection to a circuit, so the method is repeated as required until all required connections between contacts have been formed.

The component may be selected from a wide range of possibilities, including a microchip (analogue or digital), including a passivated chip having a layer of non-conductive material over exposed circuitry to prevent unwanted electrical contact, microprocessor, memory chip, timing chip, capacitor, transistor, resistor, inductor, diode, switch, relay, solenoid, microphone, speaker, amplifier, piezoelectric device or crystal, ariel or antenna, battery, fuel cell, photo-voltaic cell, solar cell, light emitting diode (LED), light emitting polymer (LEP), liquid crystal display (LCD), charge coupled device (CCD), semiconductor imaging device, or a holder, connector, terminal or socket for any of the above.

The electrical circuit is typically formed on a substrate. The material is typically deposited on the substrate to adhere thereto, in a way that is not possible with soldering.

The substrate may be of a wide range of materials, including plastics materials, paper, ceramics etc. The substrate is typically in the form of rigid or flexible sheet material, e.g. of plastics materials etc. The substrate typically has conductive tracks, including contacts, formed thereon, e.g. by photolithography. The substrate is commonly in the form of a printed circuit board.

The electrical connection is typically in the form of a track, particularly an elongate track (with length greater than width). Track width and length may be selected (and varied) as appropriate to suit requirements in a way that is not possible with existing techniques. Multiple connections need not be identical and can have individually determined dimensions.

The track width and/or length may be deliberately oversized to produce tracks of increased conductivity and/or to allow for reduced accuracy of deposition.

The electrical connection is generally selectively provided between the contacts. The electrical connection can be selectively formed to have a desired confined extent (typically a track of desired length and width). Alternatively, a layer of electrically conductive material of greater extent than necessary can be formed, and the material then selectively removed or treated, e.g. by using a mask, to leave an electrical connection in the desired region only. In this alternative approach it is not necessary for material to be deposited with such accuracy of positioning as is required in the first approach.

The method typically includes placing the component in position with respect to the circuit for connection thereto.

The component may be placed in position with respect to the circuit by a range of techniques, including human placement and mechanical placement Mechanical placement is preferred for reasons of speed and accuracy, and is preferably computer-controlled, with suitable placement devices being known to those skilled in the art, including robot means such as a pick and place robot. Pick and place robots are well suited to this use being very fast, typically being able to handle up to 60,000 units per hour, and being versatile through use of appropriate software. A plurality of components may be placed simultaneous or consecutively, by one or more devices.

The method preferably includes the step of using a detection device to detect (in automated manner, not involving human input) the position of the contact of the component with respect to the associated contact of the circuit, and depositing material between the detected positions of the contacts.

The position of the contact of the component may be detected directly, by determining the position of the contact, or indirectly by determining the position of the component and deducing from this the position of the contact based on knowledge of the position of the contact on the component.

The position of the contact of the component with respect to the associated contact of the circuit may be determined (directly or indirectly) by a variety of ways, as is known to those skilled in the art. It is preferred to use a digital imaging device such as a CCD. Alternative possibilities include use of a photodiode sensor (with position determination based, e.g., on the colour of the contact) or a proximity sensor (with determination based on sensing metal of the contact). The position determining means may include a data processing device, such as an image processing device to process data measured by an imaging device and determine the position of one or more contacts.

Material is preferably deposited by a printing process. The printing process is preferably a non-contact process and is preferably a digital process, as this permits ready regulation and control of the precise location of deposited material by use of appropriate software, without requiring physical movement of printing means for positioning purposes. In addition, use of digital printing enables the method to be used for forming connections to multiple components which need not be accurately positioned with respect to the associated circuit as appropriate compensation may be readily made. Inkjet printing is particularly well suited to this purpose. A typical industrial inkjet printhead has nozzles spaced by about 140 microns, so by selecting the appropriate nozzle or nozzles, thus material can be deposited with great accuracy without requiring mechanical repositioning of the printhead with respect to the component and circuit. By interleaving print heads, nozzle pitch can be reduced, e.g. to 35 microns with 4 interleaved print heads. Other possible digital printing techniques include laser printing, using powder toner. Other possible analogue printing techniques include pad printing, screen printing, lithographic printing, gravure printing, etc.

When using digital imaging in conjunction with digital printing, any necessary adjustment to compensate for mispositioning of components can be made by adjusting the location and/or shape of deposited material, rather then adjusting the location of the component and/or electrical circuit. In addition, multiple components may be processed and multiple connections made in a single pass through a digital printer.

The material to be deposited is typically in the form of a liquid, possibly with suspended or dispersed solids, for ease of application.

The invention provides a solderless (and free of lead) approach to formation of an electrical connection. Soldering requires more accurate positioning of a component, as only a point or spot connection is formed. Moreover, soldering is not a suitable method for bridging gaps between contacts.

The material to be deposited may be selected from a wide range of materials that constitute, form or can be processed to form, an electrically conductive connection between the contacts. For example, the deposited material may comprise metal nano-particles (deposited in a suitable liquid vehicle). On suitable treatment, such as thermal treatment, chemical treatment, exposure to ultra violet etc, the particles fuse together or anneal and form a connection with good conductive properties. Alternatively, a conductive polymer such as PEDOT (poly-3,4-ethylenedioxythiophene) may be used or produced by reaction in situ of one or more reagents. Conductive pigment inks or pastes, e.g. containing graphite or silver, may alternatively be deposited and form a conductive connection. The deposited material may alternatively comprise a metal precursor. As a further possibility, the conductive connection may be formed by an in situ metallisation reaction, as disclosed in our PCT/GB2004/000358 (WO 2004/068389). This specification discloses a method of forming a conductive metal region on a substrate, comprising depositing, (e.g. by inkjet printing, spraying, immersion etc., with inkjet printing being preferred) on the substrate a solution of a metal ion, and depositing, (e.g. by inkjet printing, spraying, immersion etc., with inkjet printing being preferred) on the substrate a solution of a reducing agent, such that the metal ion and the reducing agent react together in solution to form a conductive metal region on the substrate. This approach can produce highly electrically conductive connections between contacts.

The method of the invention conveniently involves an initial step of depositing of an activator such as a catalyst or catalyst precursor on the substrate, to activate a conductive material-forming reaction. The deposition is preferably by a digital printing process such as inkjet printing. The conductive material-forming reaction may be reaction between a metal ion and reducing agent, e.g. as disclosed in WO 2004/068389, as discussed above. Alternatively, electroless plating techniques, as are well known to those skilled in the art, may be employed. Where processing involves immersion, it is preferred to use passivated chips (having a layer of non-conductive material placed over exposed circuitry to prevent electrical contact) as these are suited to immersion, e.g. in an electroless metallisation bath. Where dealing with auto-catalytic processes, the catalyst is preferably used in sparing amounts. The activator should provide a continuous connection between the contacts to be joined but need not, and indeed preferably does not, entirely cover the contacts (at least when the contacts are formed of a metal that will support (catalyse) the conductive material-forming reaction); this is unnecessary and so is a waste of material and moreover is likely to reduce the electrical conductivity of the final connection. Thus, the activator may be deposited, e.g. in the form of a thin strip extending between the contacts. The subsequent conductive material-forming reaction, being activated by the metal contact and deposited activator, results in the conductive material growing to cover and connect both the metal contact and deposited activator regions.

As a further possibility, the activator may be deposited over an area of greater extent than the desired electrical connection, and then selectively removed or treated to render it inactive prior to the conductive material-forming reaction. In the latter case the untreated activator must be non-conducting.

Electroless or electrolytic plating techniques may optionally be used in combination with the above techniques to form a metal layer on top of the conductive material and so improve conductivity.

It is generally appropriate to secure a component to a substrate, e.g. using adhesive in known manner. Suitable adhesives are well known to those skilled in the art, including UV curable adhesives and epoxy based adhesive, as are suitable application techniques, including inkjet printing. The adhesive is optionally thermally conductive. The adhesive is preferably non-conducting (i.e. an electrical insulator). The ink should also be selected having regard to intended subsequent processing, e.g. being resistant to catalyst ink and metallisation in order to prevent debonding of the component from the substrate on subsequent processing.

A wetting control agent is advantageously applied to surfaces of the component, substrate and/or adhesive (if present) prior to deposition of material between the contacts. The wetting control agent functions to control wetting by modifying surface energy and also functions to keep a subsequently applied liquid film stably spread, e.g. prior to curing, preventing de-wetting or reticulation. Suitable wetting control agents include polymers such as polyvinylpyrrolidone (PVP), polyacrylic acid, polyvinyl acetate, polyethylene imine, polyethylene oxide, polyethylene glycol, gelatin and polymers thereof. The wetting control agent may be applied in any convenient manner, e.g. by inkjet printing. The wetting control agent is suitably applied in the form of a thin film, typically less than 1 micron thick, e.g. about 100 nm thick.

The wetting control agent functions to create more uniform surface energy on different surfaces, e.g. substrate, adhesive, component surface, leading to deposited material forming tracks of more uniform width and thickness than would otherwise be the case.

Track width of deposited material is also affected by the surface on which it is deposited, any surface coatings thereon, e.g. adhesive, the volume of material deposited and the composition of the deposited material. One skilled in the art can readily find suitable combinations of variables to give a track of deposited material of desired width.

In cases where a component protrudes significantly from a substrate and presents a stepped profile, particularly steps with right angled corners, e.g. with a chip mounted on a printed circuit board, difficulties can arise in depositing material (particularly when in liquid form) on the (vertical) side face of a component and across the right angled edge of the component between the (vertical) side face and (horizontal) top face. In particular, difficulties can arise in forming a continuous layer of liquid up the side of the component, with particular difficulties arising in wetting the sharp edge at the top of the component, and hence in producing an electrically conductive connection across the edge boundary. Various approaches are proposed to overcome such difficulties.

1) Modifying the design of component, e.g. chip, to provide the component with a bevelled, chamfered, radiuissed or curved edge in place of a right angled top edge. As a further possibility by the component, e.g. chip, may be made thinner, thus reducing step height.

2) Modifying the design of component, e.g. chip, to include a contact (pad) that extends right up to the top edge (or as close as possible thereto), that extends across the top edge and down on to the side of the component, or that is formed on the side of the component. This is helpful because the liquids (e.g. inks) typically used generally wet well across the surface of a contact but wet less well on the surface of a component, particularly in the case of passivated chips. As a result there is a tendency for only a thin film of liquid to form on the surface of a component, with liquid tending to be drawn to the contact, possibly resulting in the liquid becoming discontinuous and so not producing a continuous electrical connection.

3) Depositing an increased amount of material at the base of the step to form a slope or ramp, and so reduce the size of the step or eliminate the step completely. With inkjet printing this is readily achieved by programming the printer to print an increasingly high material deposit weight as the vertical side of the component is approached, and then reducing the deposit weight as the top of the component is reached. This is particularly useful when connecting a metal track on a circuit board (or other substrate) to a pin or other contact located on a microchip, oriented so that the pin or other contact is directed away from the circuit board so that the deposited electrical connection must extend up the side of the microchip.

There are, however, certain drawbacks and constraints associated with this approach.

For some chips (unpassivated), there is the possibility of contacting the circuitry through the edge of the chip and so any liquid (ink) or adhesive that comes into contact with the edge of the chip must be non-conducting. This technique consumes more ink (which is expensive), is more difficult to implement in terms of printing and curing, and risks forming a conductive connection to exposed circuitry (where present). Also, if the catalyst ink layer becomes too thick there can be a tendency to de-laminate from the substrate on metallisation due to induced stresses. Printing extra ink also encourages lateral spread and so the printed line or track becomes wider as it becomes thicker. To build the ramp most efficiently, it is best to print a layer of ink, cure and then print another layer, cure and repeat to the required thickness, rather than try to print a thick layer and then cure in a single operation. For these reasons, it is preferred to use the adhesive ramp building technique described below.

4) Forming a ramp of adhesive up the side of the component, leading from the substrate surface to the top of the component, to facilitate material deposition by removing or smoothing out the vertical step at the component side surface. This approach can use the adhesive that holds the component in place on the substrate, with the adhesive performing a dual function. The ramp may have a positive (convex) or negative (concave) meniscus. One preferred ramp is one that removes the 90° angle from the corner of the component, i.e. with the transition from the component to adhesive being flat and then curving gently down to the substrate. For high frequency circuits it may be beneficial for the adhesive ramp additionally to cover areas of the component between the top edge and contact. This will increase the distance between the conductive track and the component and so reduce any capacitive coupling which may occur.

The adhesive can be applied before or after component placement. In the former case, adhesive can be placed on the substrate in appropriate position (so as not completely to cover contacts, e.g. by careful placement of adhesive or by use of non-wetting adhesive that does not cover metal contacts), and the component then placed in position, on the adhesive. The adhesive will be displaced, and will tend to form ramps leading from the substrate surface up the sides of the component, with a positive meniscus. Alternatively, the component can be placed in position directly on the substrate and adhesive then applied to form ramps leading from the substrate surface up the sides of the component, in this case more likely with a negative meniscus. In both cases, material is then deposited between the contacts to be connected, passing up and over the adhesive ramp.

For approaches 3 and 4, it is important that the material that forms the ramp up the side of the component contacts (wets) the side surface of the component and does not result in a gap being left between the ramp and the component. To assist this, the component may be pre-treated with wetting control agent, (e.g. PVP) as discussed above, to control wetting by modifying surface energy and to keep the liquid film stably spread e.g. prior to curing (preventing de-wetting or reticulation). When exposed circuitry is present, it is also important that the adhesive forms a good sealing bond to the side surface of the component to prevent conductive material from seeping down between the component and the adhesive ramp.

The method may include the step of depositing one or more layers of material on the substrate where the electronic component is to be placed, prior to placement of the component on the substrate. For example, a conductive metal layer may be deposited where the electronic component is to be placed. This may function as a heat sink. This is particularly convenient when an electronic component which requires a heat-sink, for example, a microchip, is placed with the one or more contacts located away from the substrate. Generally, microchips which require heat sinks have contact pins extending in one direction, and a face, in the opposite direction, which is to be thermally connected to a heat sink. However, by depositing a heat sink on the surface of the substrate, the microchip or other electronic component can be conveniently thermally connected to a heat sink on a surface facing the substrate, and electrically connected to a circuitry on one or more other faces, such as via contact pads on the side facing away from the substrate. A thermally conductive material may be deposited on top of a conductive metal layer to improve thermal conductivity between the electronic component and the heat sink.

The method may also involve printing a protective overcoating, (e.g. potting or encapsulation layer) over the entire assembly of substrate and one or more components.

The various optional additional printing steps may be performed using the various methods discussed above.

The method may be carried out as a batch process, but is preferably operated on a continuous basis, e.g. on a production line/conveyor. In this case the steps of placement, position detection and deposition (of one or more materials) can be performed simultaneously at different locations on different components at different stages of processing, so enhancing throughput.

The invention finds particular application in the production of RFID tags. The method of the invention may be used to connect an RFID chip to a RFID antenna. The method may alternatively be used to print an RFID antenna directly to contacts on an RFID chip, with the deposition of material to form the antenna and connections to the chip occurring in a single step, without forming the connection between the chip and the antenna in a separate step. In this case, the connection in part constitutes the antenna.

Use of a deposition technique to produce an electrical connection between contacts is a simple, convenient and versatile approach.

Further, in preferred embodiments involving a detecting step, the method of the invention differs from prior art techniques by detecting the position of a component contact with respect to the associated contact of the circuit after placement of the component in position (at least approximately accurately) with respect to the circuit for connection thereto. An electrical connection is then formed between the detected positions of the contacts by depositing material therebetween, generally linking the contacts, with the material forming or being processed to form the connection. As a result, the component does not need to be positioned with respect to the circuit with total accuracy, as mispositioning can be accommodated by depositing the connection-forming material in the correct location, as subsequently detected. The requirement for component placement accuracy in the method of the invention can be significantly reduced when compared to known techniques. In consequence components can be placed more rapidly, with potentially improved production rates and lower equipment costs. Furthermore, detecting the actual position of the contacts to be connected and forming the connection therebetween can be achieved more accurately than current component placement techniques: using digital imaging techniques positions can be detected to an accuracy of +/−1 micron or better, whereas the best current component placement accuracy is typically of the order of +/−30 microns.

Other benefits of the invention include the ability to use a component in standard form without the need for special processing, such as 'bumping', mounting on an interposer etc; a reduced number of steps or processes in the production of a finished item, e.g. no need to encapsulate fragile wire bonds, no need to form 'bumps'; simplicity compared with the difficulty and high cost of wire bonding; no need to use speciality adhesives. When deposition is by a digital process, this allows development prototypes, one-offs and customised products to be produced cost effectively, as modifications can be produced by use of appropriate software control. When deposition is by a non-contact process, e.g. inkjet printing, this allows connections to be made over surfaces that are not necessarily flat, e.g. over three dimensional objects.

The invention also includes within its scope apparatus for electrically connecting a contact of a component to an associated contact of an electrical circuit, comprising placement means for placing a component in position with respect to the circuit for connection thereto; and deposition means for depositing material between the contacts, the material being capable of forming or being processed to form an electrical connection between the contacts.

The apparatus preferably also includes a detection device for detecting the position of a contact of the component with respect to the associated contact of the circuit. In this case, the deposition means is for depositing material between the detected positions of the contacts.

Suitable means for performing these functions are as discussed above.

Thus, the placement means conveniently comprises a computer-controlled mechanical device such as a pick and place robot. A single placement means may place a plurality of components simultaneously or consecutively.

The detection device preferably comprises a digital imaging device such as a CCD camera. The detection means may include a data processing device, such as an image processing device, to process data measured by an imaging device and determine the position of one or more contacts.

The deposition means preferably comprise digital printing means such as one or more inkjet printers.

The various components of the apparatus are all conveniently controlled for synchronised operation by computer-control means.

The invention also covers the resulting connected component and circuit, i.e. an electrical circuit including a component connected by the method of the invention or using the apparatus of the invention.

Typical applications of the invention include in the production of RFIDs (connecting an RFID chip to an antenna on a substrate and possibly also forming the antenna), smart cards, credit cards, electronic security devices and many others, as will be apparent to those skilled in the art. The invention includes within its scope an electronic product including a circuit with a component connected by the method or apparatus of the invention.

The invention will be further described, by way of illustration, in the following Examples and with reference to the accompanying drawings, in which.

DETAILED DESCRIPTION OF THE DRAWINGS

Figure 1:
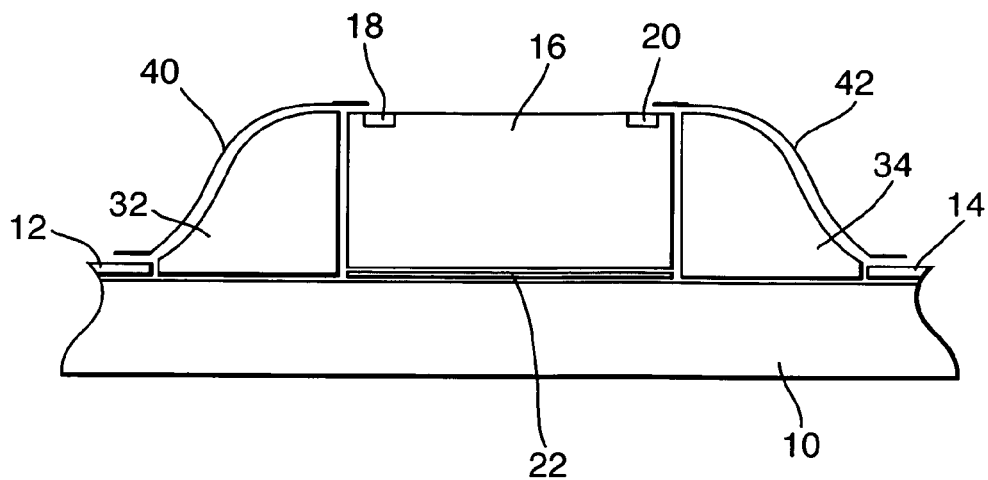
FIG. 1 is a schematic sectional view of a component connected to contacts on a substrate using a method and apparatus in accordance with the invention.
Figure 2:
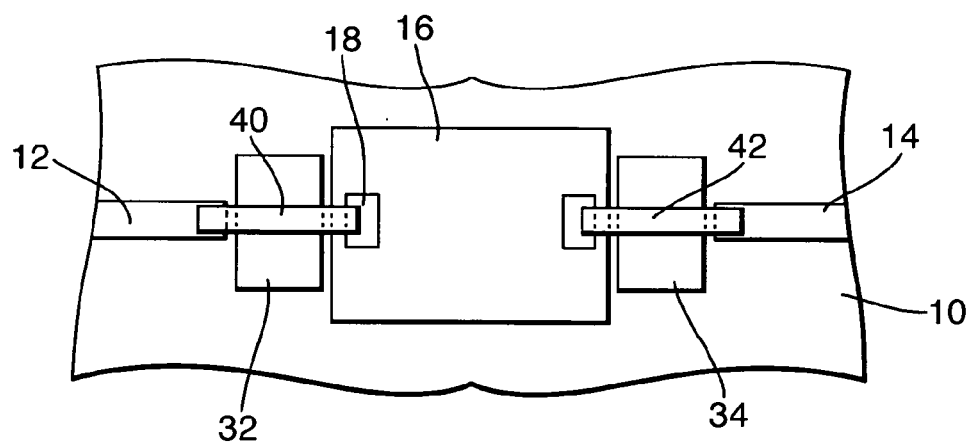
FIG. 2 is a schematic plan view of the component and substrate shown in FIG. 1.

Referring to the drawings, FIGS. 1 and 2 show a portion of a substrate 10 of plastics sheet material carrying metal tracks 12 and 14 forming part of electrical circuitry. The tracks 12 and 14 terminate in contacts for an electrical component 16, having metal contacts 18 and 20 on the upper surface thereof. A metal heat sink 22 having a footprint corresponding to that of chip 16 is formed on the substrate, conveniently using the in situ metallisation method of PCT/GB2004/000358 (WO 2004/068389).

Figure 3:
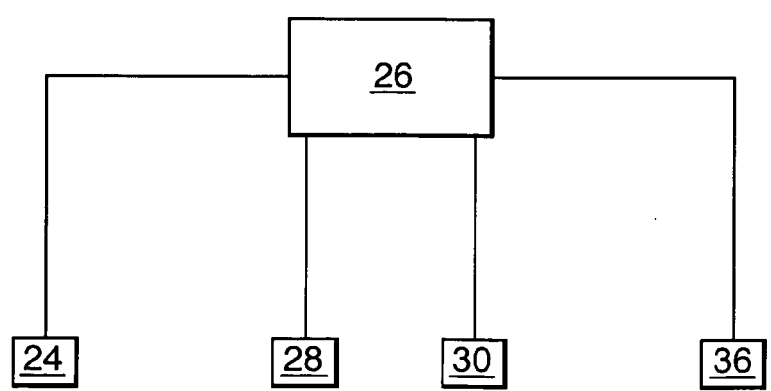
FIG. 3 is a schematic representation of one embodiment of apparatus in accordance with the invention.

Component 16 is placed on substrate 10, on top of heat sink 22 in at least the approximately precise location, using a pick and place robot 24 (shown schematically in FIG. 3) under control of computer means 26 (shown schematically in FIG. 3). The substrate and chip are then imaged using a CCD camera 28 (shown schematically in FIG. 3) to detect (directly or indirectly) the actual position of the contacts at the end of tracks 12 and 14 and the contacts 18 and 20 of the components. CCD camera 28 conveys information on position to computer means 26. An adhesive is then deposited using inkjet printer 30 (shown schematically in FIG. 3) in the gap between track end 12 and contact 18 and the gap between track end 14 and contact 20, forming respective ramped regions of adhesive 32 and 34 approximately linking the two pairs of contacts to be connected. The adhesive is accurately delivered to between the detected positions of the contacts, as determined by CCD camera 28, under control of computer means 26. Using inkjet printer 36 (shown schematically in FIG. 3), also under control of computer means 26, material is deposited to extend between track end 12 and contact 18, over adhesive ramp 32 and between track end 14 and contact 20 over adhesive ramp 34, the material being accurately placed on the basis of the detected positions of the contacts as determined by CCD camera 28. The deposited material forms or is processed to form respective electrical connections 40 and 42, e.g. using the in situ metallisation method of WO 2004/068389. The two connections may be formed sequentially or simultaneously. The component 16 is thus connected into the electrical circuitry carried by the substrate 10.

The invention is further illustrated in the following Examples.

EXAMPLE 1

No Adhesive

A flexible Melinex (Melinex is a Trade Mark) polyester sheet, printed with a circuit has 4 connections to be connected to an EM4100 read only contact-less identification chip, supplied by EM Microelectronic. The chip is 1016× 1041 microns in plan and 440 microns thick, with 4 contacts arrayed on the underside of the chip. Two of the contacts are 76×76 microns and the other two are 95×95 microns.

A Fuji CP7 (Fuji is a Trade Mark) series high speed chip 'pick and place' robot is used to place the chip onto the substrate, with the contacts visible on the top surface of the chip. This robot is capable of placing 52,941 components per hour at an accuracy of +/−66 microns.

A National Instruments 'NI Vision System 1400' (National Instruments is a Trade Mark) machine vision system is then used to detect accurately the position of the chip, relative to the contacts of the printed circuit. This system uses a RS-170 camera connected to a NI PCI-1409 image capture board in conjunction with the LabView (LabView is a Trade Mark) software accurately to image the position of the chip on the substrate and accordingly modify the conductive connection image to be printed.

The modified image is sent to the print head controller, a Xennia XPC-XJ500 (Xennia is a Trade Mark); this system drives a XaarJet 500/360 (XaarJet is a Trade Mark) print head, which has 500 nozzles arranged at 180 dpi spacing and prints 40 pL droplets. The print head is scanned across the substrate in 70 mm wide swathes and prints a fluid that forms 75 microns wide and 5 mm long connections between the contacts on the PCB and the contacts on the chip.

The fluid printed maybe an activator ink containing palladium ions, such as the formulation specified in Table 1 below. In Table 1, the amounts of the ingredients are expressed as % w/w.

TABLE 1

UV curable activator ink formulation.

| | |
|---|---|
| Palladium acetate | 2 |
| Irgacure 1700 | 3.25 |
| Irgacure 819 | 1.25 |
| DPGDA | 48 |
| DPHA | 3 |
| Actilane 505 | 10 |
| Diacetone alcohol | 15 |
| Methoxy propanol | 15 |
| PVP K30 | 2.5 |
| Viscosity, cPs (25° C.) | 11.2 |

Irgacure 1700, Irgacure 819 and Actilane 505 are Trade Marks. PVP K30 is K30 grade polyvinylpyrrolidone from International Speciality Products, which has a molecular weight between 60,000 and 70,000. Actilane 505 is a reactive tetrafunctional polyester acrylate oligomer supplied by AKZO Nobel UV Resins, Manchester, UK. DPHA (dipentaerythritol hexaacrylate) is a hexafunctional monomer supplied by UCB, Dragenbos, Belgium. Irgacure 819 and Irgacure 1700 are UV photo-initiators supplied by Ciba Specialty Chemicals, Macclesfield, UK. DPGDA is dipropylene glycol diacrylate supplied by UCB, Dragenbos, Belgium.

Once printed, the activator ink is cured to a solid film using a Fusion (Fusion is a Trade Mark) UV 500 W lamp fitted with an H-bulb. The activator film is then treated with a reductant (dimethylamineborane) to reduce the palladium ions to palladium metal and generate a catalyst for the metal deposition reaction.

The catalyst is then treated with a copper layer forming solution (consisting of Enplate 872A (30% w/w), Enplate 872B (30% w/w), Enplate 872C (10% w/w), t-butanol (5% w/w), ethylene glycol (20% w/w) and polyethylene glycol 1500 (5% w/w). (Enplate 872A, 872B and 872C are copper plating solutions supplied by Enthone Ltd of Woking, UK. Enplate is a Trade Mark). This treatment maybe applied by a second inkjet printing stage, similar to the application of the activator, or by immersion, in a bath process. The solution is applied for about 2 minutes to form a layer of copper about 1 micron thick, which forms conducting connections between the contacts of the printed circuit and the contacts of the chip.

EXAMPLE 2

Addition of Adhesive Ramp

The procedure of Example 1 is repeated, with the following addition. After placement of the chip and before imaging, a Fuji GL-541E high speed glue dispenser is used to dispense drops of epoxy adhesive at a rate of 11 drops per second on either side of the chip, next to the contacts, to generate a small ramp of adhesive for the conductive connection to be printed up and over.

EXAMPLE 3

A flexible Melinex (Melinex is a Trade Mark) polyester sheet, printed with a circuit has 4 connections to be connected to an EM4100 read only contact-less identification chip, supplied by EM Microelectronic. The chip is 1016× 1041 microns in plan and 440 microns thick, with 4 contacts arrayed on the underside of the chip. Two of the contacts are 76×76 microns and the other two are 95×95 microns.

A Fuji GL-541E (Fuji is a Trade Mark) high speed glue dispenser is used to dispense drops of epoxy adhesive at a rate of 11 drops per second in the position where the chip is to be located, next to the contacts. Excess adhesive is applied so that on placement of the chip a meniscus ramp of adhesive is generated at the sides of the chip for the conductive connection to be printed up and over.

A Fuji CP7 series high speed chip 'pick and place' robot is used to place the chip onto the substrate, with the contacts visible on the top surface of the chip. This robot is capable of placing 52,941 components per hour at an accuracy of +/−66 microns.

A National Instruments 'NI Vision System 1400' machine vision system is then used to detect accurately the position of the chip, relative to the contacts of the printed circuit. This system uses a RS-170 camera connected to a NI PCI-1409 image capture board in conjunction with the LabView software accurately to image the position of the chip on the substrate and accordingly modify the conductive connection image to be printed.

The modified image is sent to the print head controller, a Xennia XPC-XJ500; this system drives a XaarJet 500/360 print head, which has 500 nozzles arranged at 180 dpi spacing and prints 40 pL droplets. The print head is scanned across the substrate in 70 mm wide swathes and prints a fluid that forms 75 microns wide and 5 mm long connections between the contacts on the PCB and the contacts on the chip.

The fluid printed is an activator ink containing palladium ions, having the formulation specified in Table 2 below. In Table 2, the amounts of the ingredients are expressed as % w/w.

TABLE 2

UV curable activator ink formulation.

| Material | % w/w |
|---|---|
| Palladium acetate | 2 |
| Irgacure 1700 | 3.25 |
| Irgacure 819 | 1.25 |
| DPGDA | 30.5 |
| DPHA | 3 |
| Actilane 505 | 10 |
| Diacetone alcohol | 47.5 |
| PVP K30 | 2.5 |

Irgacure 1700, Irgacure 819 and Actilane 505 are Trade Marks. PVP K30 is K30 grade polyvinylpyrrolidone from International Speciality Products, which has a molecular weight between 60,000 and 70,000. Actilane 505 is a reactive tetrafunctional polyester acrylate oligomer supplied by AKZO Nobel UV Resins, Manchester, UK. DPHA (dipentaerythritol hexaacrylate) is a hexafunctional monomer supplied by UCB, Dragenbox, Belgium. Irgacure 819 and Irgacure 1700 are UV photo-initiators supplied by Ciba Specialty Chemicals, Macclesfield, UK. DPGDA is dipropylene glycol diacrylate supplied by UCB, Dragenbos, Belgium.

Once printed, the activator ink is cured to a solid film using a Fusion UV 500 W lamp fitted with an H-bulb. The activator film is then treated with a reductant by immersion in a bath comprising 1.6% dimethylamineborane (DMAB), to reduce the palladium ions to palladium metal and generate a catalyst for the metal deposition reaction.

The catalyst is then treated with a copper layer forming solution (consisting of Enplate 872A (10.71% w/w), Enplate 872B (10.71% w/w), Enplate 872C (3.57% w/w), water (75% w/w). (Enplate 872A, 872B and 872C are copper plating solutions supplied by Enthone Ltd of Woking, UK. Enplate is a Trade Mark). This treatment is applied by immersion, in a bath process. The solution is applied for about 2 minutes to form a layer of copper about 0.5 micron thick, which forms conducting connections between the contacts of the printed circuit and the contacts of the chip. The resistivity of the connections was around 3-4 Ohms/mm.

The invention claimed is:

1. A method of electrically connecting a contact of a component to an associated contact in or for an electrical circuit, comprising using adhesive to secure the component to a substrate carrying the electrical circuit, wherein the adhesive forms a ramp leading from the substrate surface to the top surface of the component and depositing material between the contacts, the material forming or being processed to form an electrical connection between the contacts.

2. A method according to claim 1, comprising applying a wetting control agent prior to deposition of the material.

3. A method according to claim 1, including placing the component in position with respect to the circuit for connection thereto.

4. A method according to claim 3, wherein the component is mechanically placed in position with respect to the circuit.

5. A method according to claim 1, wherein the electrical connection is in the form of a track of desired width and length.

6. A method according to claim 1, including using a detection device to detect the position of the contact of the component with respect to the associated contact of the circuit, and depositing material between the detected positions of the contacts.

7. A method according to claim 6, wherein the position of the contact of the component with respect to the associated contact of the circuit is determined by a digital imaging device.

8. A method according to claim 1, wherein material is deposited by a printing process.

9. A method according to claim 8, wherein the printing process is a digital printing process.

10. A method according to claim 9 when dependent on claim 7, wherein the location and/or pattern of deposited material is adjusted in response to the determined position of the contact.

11. A method according to claim 1, wherein the conductive connection is formed by an in situ metallisation reaction that comprises depositing a solution of a metal ion, and depositing a solution of a reducing agent, such that the metal ion and the reducing agent react together in solution to form a conductive metal region.

12. A method according to claim 1, wherein the material deposited is selected from metal nano-particles, conductive polymers, conductive inks or pastes and metal precursors.

13. A method according to claim 1, including depositing an activator on the substrate, to activate a conductive material-forming reaction.

14. A method according to claim 1, wherein a component is placed on a substrate such that it protrudes from a substrate and presents a stepped profile, and wherein an increased amount of material is deposited at the base of the step, to form a slope or ramp and thus reduce the size of the step.

15. A method of electrically connecting a contact of a component to an associated contact in or for an electrical circuit on a substrate, comprising securing the component to the substrate using adhesive, with the adhesive forming a ramp leading from the substrate surface to the top surface of the component, and depositing material on the ramp between the contacts, the material forming or being processed to form an electrical connection between the contacts.

16. A method of electrically connecting a contact of a component to an associated contact in or for an electrical circuit positioned on a substrate surface which comprises securing the component to the substrate surface with the contact of said component positioned above said substrate and the associated contact, said component being secured to said substrate surface by an adhesive which forms a ramp positioned between the two contacts and depositing conductive material on said ramp between said contacts such that said material forms or provides an electrical connection between said contacts.

* * * * *